219-121
4/14/81 XR 4,261,764 SR

United States Patent [19]
Narayan

[11] 4,261,764
[45] Apr. 14, 1981

[54] LASER METHOD FOR FORMING LOW-RESISTANCE OHMIC CONTACTS ON SEMICONDUCTING OXIDES

[75] Inventor: Jagdish Narayan, Knoxville, Tenn.

[73] Assignee: The United States of America as represented by the United States Department of Energy, Washington, D.C.

[21] Appl. No.: 80,725

[22] Filed: Oct. 1, 1979

[51] Int. Cl.³ .................... H01L 21/263; H01L 7/18; B23K 9/00

[52] U.S. Cl. ................................ 148/1.5; 219/121 L; 357/65; 357/70; 357/91

[58] Field of Search .................... 148/1.5; 357/65, 70, 357/91; 219/121 L

[56] References Cited

U.S. PATENT DOCUMENTS

| | | | |
|---|---|---|---|
| 3,323,947 | 6/1967 | Kahng et al. | 117/213 |
| 3,424,890 | 1/1969 | Van Ruyven | 219/121 |
| 3,600,797 | 8/1971 | Bower | 29/584 |
| 3,649,807 | 3/1972 | Stork | 219/121 EB |
| 3,666,567 | 5/1972 | Hunsperger et al. | 148/1.5 |
| 3,771,026 | 11/1973 | Asai et al. | 317/234 R |
| 3,955,013 | 5/1976 | Kivlighn, Jr. | 427/53 |
| 4,042,006 | 8/1977 | Engl et al. | 164/46 |
| 4,147,563 | 4/1979 | Narayan et al. | 148/1.5 |

OTHER PUBLICATIONS

Hodgen et al, IBM-Tech. Disc. Bull. 21 (Mar. 1979) 4286.
Cook et al, Appl. Phys. Letts. 26 (1975) 124.
Platakis, N. S., Jour. Appl. Phys. 47 (1976) 2120.
Broom et al, IBM-Tech. Disc. Bull. 15 (1972) 2158.
Flaschen et al, J. Appl. Phys. 27(2) (1956) 190.
Sauer et al, Ceramic Bulletin 39(6) (1960) 304.
Turner et al, J. Electrochem. Soc. 107(3) (1976) 715.
Fleming et al, Cer. Bull. 55(8) (1976) 715.

*Primary Examiner*—G. Ozaki
*Assistant Examiner*—Upendra Roy
*Attorney, Agent, or Firm*—Fred O. Lewis; Stephen D. Hamel; Richard G. Besha

[57] ABSTRACT

This invention is a new method for the formation of high-quality ohmic contacts on wide-band-gap semiconducting oxides. As exemplified by the formation of an ohmic contact on n-type $BaTiO_3$ containing a p-n junction, the invention entails depositing a film of a metallic electroding material on the $BaTiO_3$ surface and irradiating the film with a Q-switched laser pulse effecting complete melting of the film and localized melting of the surface layer of oxide immediately underlying the film. The resulting solidified metallic contact is ohmic, has unusually low contact resistance, and is thermally stable, even at elevated temperatures. The contact does not require cleaning before attachment of any suitable electrical lead.

This method is safe, rapid, reproducible, and relatively inexpensive.

17 Claims, 4 Drawing Figures

LASER METHOD FOR FORMING LOW-RESISTANCE OHMIC CONTACTS ON SEMICONDUCTING OXIDES

BACKGROUND OF THE INVENTION

1. Field of the Invention

This invention relates generally to methods for the formation of ohmic contacts on bodies of semiconducting materials and more particularly to the formation of low-resistance ohmic contacts on semiconducting oxides. The term "ohmic contact" is used herein to refer to a metallic (metal or metal-alloy) electrode whose electrical resistance is constant in an applied electric field. The term "low-resistance ohmic contact" is used herein to refer to ohmic contacts whose resistance is only a small percentage of that of the typical junction device. The term "semiconducting oxide" is used to refer to wide-band-gap semiconducting materials having oxygen as a constituent—as, for example, barium titanate ($BaTiO_3$), lithium niobate, and zinc oxide. The semiconducting oxide may be of the n- or p-type and may or may not contain an electrical junction.

2. Problem

The utilization of n-type semiconducting-oxide devices has been limited by the lack of a relatively simple, rapid, and reproducible method for providing the oxide with high-quality metallic contacts for the attachment of electrical leads. Various conventional techniques (e.g., vapor-deposition) produce satisfactory contacts on other semiconductor materials but when applied to n-type semiconducting oxides they often result in contact resistances which are unsuitably high. Such techniques are believed to be deficient because they do not disrupt a space charge layer present on the surface of the oxide material. That is, it is believed that absorbed oxygen acceptor states at the oxide surface result in a depletion layer at the oxide-to-contact interface, creating a current barrier.

Low-resistance ohmic contacts may be formed on n-type semiconducting oxides by methods which entail mechanical or chemical disruption of the above-mentioned space-charge layer, but these methods are subject to significant disadvantages. For instance, ohmic contacts can be formed on the oxides by chemically depositing a layer of nickel and then heat-treating the layer. Unfortunately, that technique requires relatively complex equipment and presents waste disposal problems. Another conventional contact-forming technique comprises the deposition of metals such as gold and silver by flame-spraying; however, this requires relatively expensive equipment and is attended by health and safety problems associated with metal inhalation and noise. Another known contact-forming technique comprises rubbing the oxide surface with indium wetted with mercury or gallium. The resulting contacts are not highly uniform, however, and they age quickly at room temperature. The prior art also includes forming ohmic contacts by ultrasonically soldering indium-based alloys to the oxide. Unfortunately, the resulting contacts do not have as high a uniformity as desired, and they are useful only in the temperature range below about 300° C.

U.S. Pat. No. 4,147,563, issued on Apr. 3, 1979, to J. Narayan and R. T. Young, discloses the use of laser pulses to diffuse a superficial layer of dopant material into a silicon substrate to form a p-n junction therein or to form silicide contacts. U.S. Pat. No. 4,181,538 issued on Jan. 1, 1980 to J. Narayan, C. W. White, and R. T. Young, discloses the use of laser-pulse annealing to improve the electrical properties of doped or undoped silicon substrates.

OBJECTS OF THE INVENTION

Accordingly, it is an object of this invention to provide a novel method for forming ohmic contacts on semiconducting oxides.

It is another object to prove a method for forming ohmic contacts on semiconducting-oxide bodies containing electrical junctions, the contacts being characterized by relatively low resistivity and contact resistance.

It is another object to provide a rapid and convenient method for forming ohmic contacts which individually and collectively are characterized by high uniformity.

It is another object to provide a rapid and convenient method for forming low-resistance ohmic contacts which are stable over a wide temperature range.

Other objects, advantages, and features of the invention will become apparent from the drawings and following description.

SUMMARY OF THE INVENTION

This method for forming an ohmic contact on a semiconducting oxide comprises depositing a thin metallic film on the oxide and then irradiating the film with a Q-switched laser pulse to effect melting of (a) the film and (b) the oxide surface in facial contact therewith.

DESCRIPTION OF THE PREFERRED EMBODIMENTS

Figure 1:
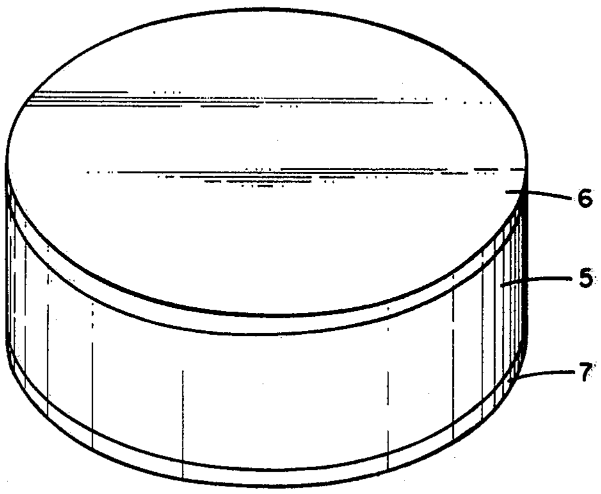
FIG. 1 is a perspective view of an n-type $BaTiO_3$ disk whose faces have been provided with ohmic contacts by means of this invention.

This invention is a new and highly effective method for forming thermally stable, low-resistance ohmic contacts on wide-band-gap semiconducting oxides, such as $BaTiO_3$ wafers containing electrical junctions. As will be shown, the method is essentially free of the above-mentioned disadvantages of the prior art and is well adapted for use on a mass-production basis. The method is applicable to both n-type and p-type semiconducting oxides, but for brevity will be illustrated herein chiefly in terms of the n-type.

The following briefly describes a preferred form of the invention as applied to the formation of ohmic contacts on a disk composed of high-purity, n-type, polycrystalline $BaTiO_3$. Initially, the deposition site for the contact is cleaned thoroughly in any suitable manner, as by mechanical polishing followed by chemical etching. The cleaned surface then is provided with a film of any suitable metallic electrode material having a strong affinity for oxygen—e.g., aluminum—the film having a thickness of, say, one micron and being formed by any suitable technique, such as electron-beam deposition. The resulting film is irradiated in any suitable atmosphere with a Q-switched laser pulse whose parameters are selected to effect melting, but not evaporation, of the film and localized melting of the surface layer of oxide in facial contact therewith. That is, melting of the oxide is effected in a thin surface region which includes the above-mentioned space-charge layer (typically having a thickness of less than about fifty angstroms.) Any suitable electrical lead then is connected to the resulting solid contact by a suitable technique, such as soldering.

I have found that, somewhat surprisingly, a suitably selected laser pulse can be used to effect melting of the deposited metallic film without heating the oxide body as a whole or adversely affecting the properties of an electrical junction in the body. That is, despite the fact that the oxide substrate is "transparent" [meaning that the photon energy ($h\nu < E_g$) is less than the band gap], the energy absorbed in the metallic layer is enough to effect melting thereof in thicknesses up to at least 1.5 μm.

EXAMPLE

This invention was used to form low-resistance, stable ohmic contacts on n-type polycrystalline barium titanate suitable for the production of junction devices. The barium titanate (yttrium-doped; resistivity, 35 Ω/cm) was in the form of disks having a diameter of 1.5 cm and a thickness of 0.1 cm. Prior to treatment in accordance with the invention, the disks were cleaned in conventional fashion by polishing with alumina powder (particle size, up to 0.1 μm) and then chemically etching in a solution consisting of 5% HF, 10% $HNO_3$, and 85% $H_2O$. The etched disks were rinsed in deionized water and ovendried in air at 150° C. for 30 minutes. To permit determination of the resistivity of the disks, indium-tin contacts were formed on the disk faces by conventional ultrasonic soldering. (This type of contact was selected because it is characterized by unusually low contact resistance.) Following determination of the resistivity (by standard techniques to be discussed), the indium-tin contacts were removed by mechanical grinding and the disks were re-cleaned as described above.

In accordance with the invention, films of either aluminum or nickel were deposited on both sides of some of the re-cleaned disks, using conventional electron-beam evaporation in a vacuum of less than $10^{-6}$ torr. The remaining disks were subjected to an additional cleaning operation (exposure to 1- keV argon ions), following which aluminum or nickel films were formed thereon by means of conventional sputter-deposition. In all instances the metals were deposited to form a film having a thickness of essentially one micron. FIG. 1 illustrates the typical metallized disc, the $BaTiO^3$ substrate being designated by the numeral 5 and the metal films by 6 and 7, respectively.

In accordance with the invention, the metallized faces of the various disks were each irradiated with a single laser pulse selected to effect melting (with little or no evaporation) of the entire metal layer and a very thin layer of the substrate underlying the same. The irradiation was conducted in air. The pulses were generated by a conventional Q-switched ruby laser ($\lambda = 0.694$ μm). The energy densities E of the various pulses were in the range from 1.0 to 1.2 J $cm^{-2}$; the pulse durations were in the range of 15 to $25 \times 10^{-9}$ seconds. The energy window (the range in pulse energy densities effecting melting but not evaporation) was found to be very small (approximately 0.2 J $cm^{-2}$) for any one film. A small energy window is believed to be typical of metallic films on wide-band-gap semiconducting oxides.

Before discussing the electrical properties of the contacts produced by laser-melting, it is pointed out that "apparent resistivity" ($\rho_A$) is expressed as follows:

$$\rho_A = R_c(2A/t) + \rho_t$$

where $R_c$ is contact resistance, A is contact area, t is thickness of the specimen (i.e., the contact and substrate), and $\rho_t$ is the true bulk resistivity of the specimen. The resistance measurements discussed below were made with a calibrated pulse-type, digital multimeter (Model HP-6177C, Hewlett-Packard Company). In order to avoid errors due to heating, a standard capacitor-discharge-type pulse tester having a 100 μ-sec time constant was used to measure the resistance at higher voltages (>5 V/cm). To determine the ohmic nature of the contacts produced by laser-melting, the resistance was measured under applied fields ranging from 0.002 to 10 V/cm. For fields less than 5 V/cm, a standard power supply was used as a constant-current source, and the voltage across the sample was measured with a digital multimeter (Model 160, Keithley Instruments, Inc.). The effects of aging at ambient temperature were determined by measuring the resistances for two weeks, once every 24 hours. To determine stability of the contacts at elevated temperatures, some of these specimens were first coated with a one-micron-thick gold film and then heated to temperatures up to 700° C. Their resistances then were re-measured at room temperature.

Figure 2:
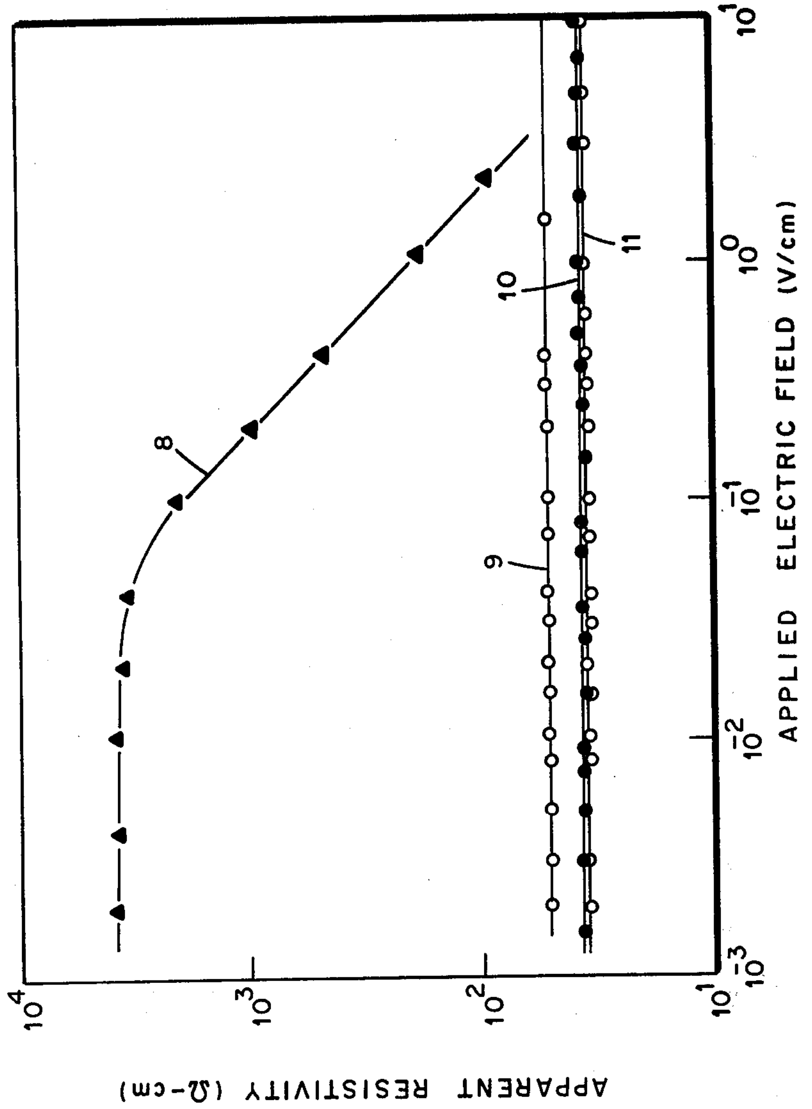
FIG. 2 is a graph correlating apparent electrical resistivity and applied electric field for various metallic contacts formed on n-type $BaTiO_3$.

FIG. 2 presents correlations of apparent resistivity and applied electric field for several of the $BaTiO_3$ disks referred to above. Plot 8 represents a disk on which a nickel contact (thickness, 1.0 μm) was deposited by electron-beam evaporation. As indicated, the apparent resistivity of electron-beam evaporated films is comparatively high and exhibits non-ohmic (voltage-dependent with a slope of −1), behavior indicative of a high-resistivity space charge region between the film and the semiconductor layers. Plot 9 represents a disk provided with a sputter-deposited nickel contact (thickness, 1.0 μm). As shown, sputter-deposited contacts have a lower resistance than electron-beam evaporated contacts and exhibit ohmic characteristics. Plot 10 is presented for the purpose of comparison and represents the typical $BaTiO_3$ disk as provided with an indium-tin contact formed by ultrasonic soldering. Such contacts are ohmic and have perhaps the lowest contact resistance previously achieved in the art. Plot 11 represents both the electron-beam evaporated contact (plot 8) and the sputter-deposited contact (plot 9) after treatment in accordance with this invention—i.e., after irradiation with one Q-switched ruby-laser pulse having the following parameters: $\lambda = 0.694$ μm; $E = 1.20$ J $cm^{-2}$; $\tau = 20$ n-sec. As shown, irradiation of these contacts decreased their resistivities appreciably, to a value below that of the ultrasonically soldered contact (plot) 10. (It is well known that indium-tin contacts have contact resistances of about 0.1 Ω $cm^{-2}$ or lower.) As shown, the irradiated contacts exhibited completely ohmic behavior in the applied electric field over their entire areas.

Figure 3:
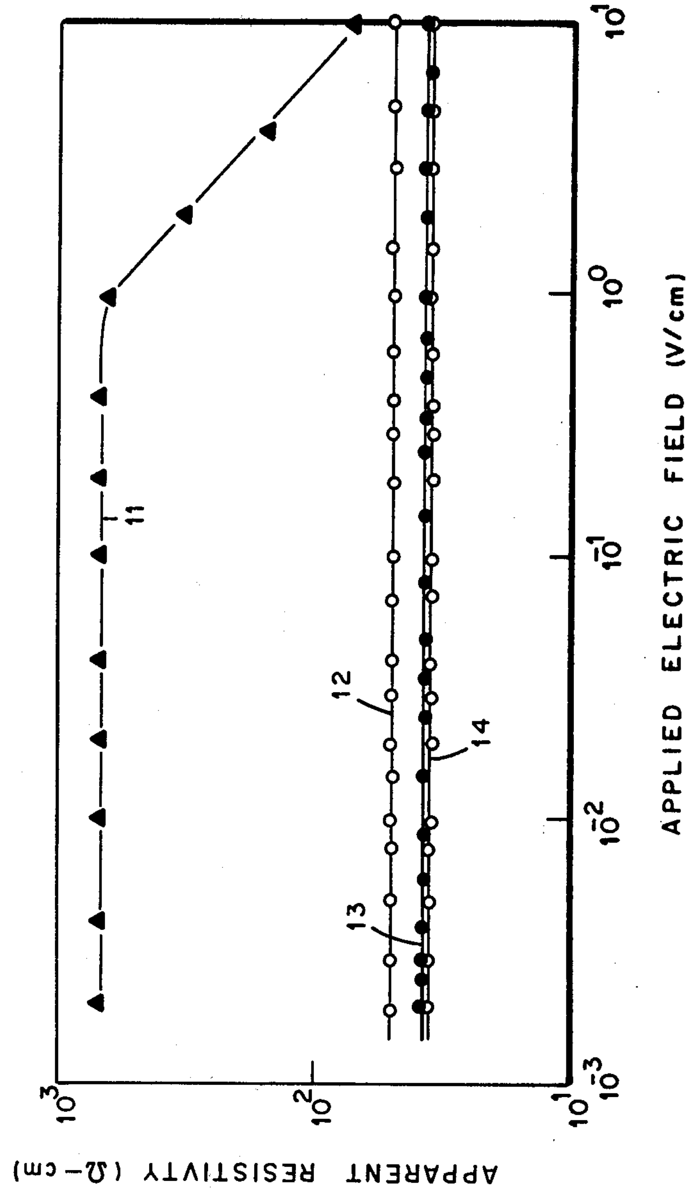
FIG. 3 is an analogous graph.

FIG. 3 is analogous to FIG. 2 and compares various contacts as follows: Plot 11, electron-beam-deposited aluminum (thickness 1.0 μm); plot 12, sputter-deposited aluminum (1.0 μm); plot 13, ultrasonically soldered indium-tin; plot 14, the same electron-beam and sputter-deposited aluminum contacts after each was irradiated with a single laser pulse of the kind referred to above in connection with FIG. 2. The results obtained in FIGS. 2 and 3 were confirmed by additional measurements made on other aluminum or nickel contacts which had been formed on $BaTiO_3$ in accordance with the invention. That is, the tests confirmed that the contact resistances were both ohmic and relatively small. Typically, the melt front penetrated the oxide to a depth of less than 100 Å.

Figure 4:
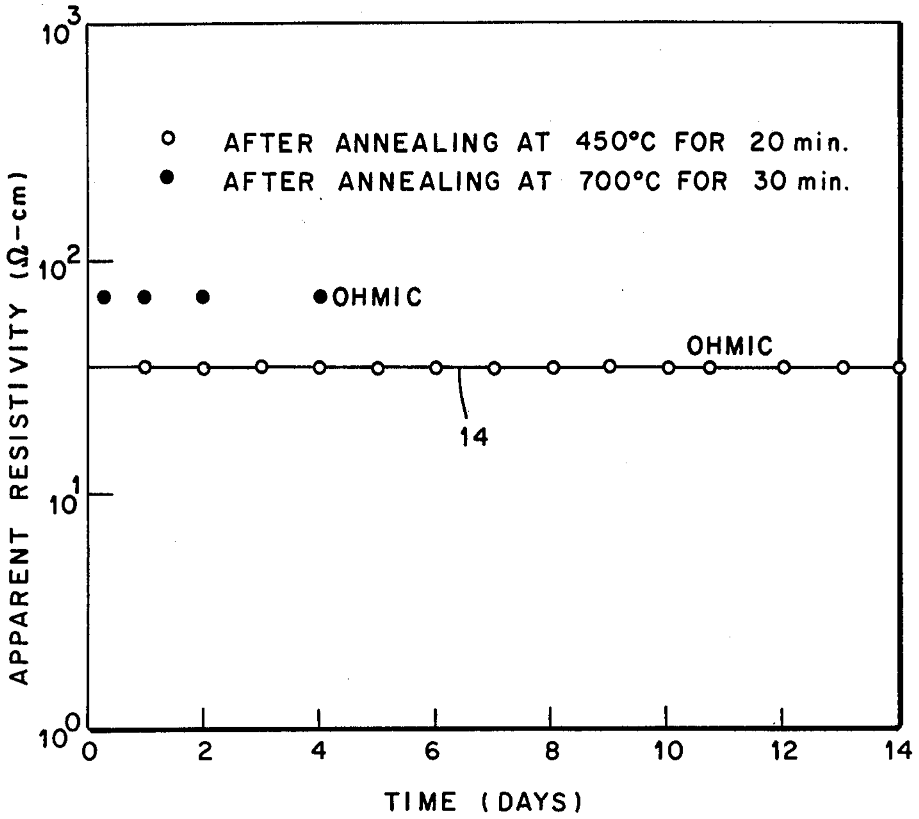
FIG. 4 is a graph depicting the aging characteristics for two thermally annealed nickel contacts formed on n-type $BaTiO_3$ in accordance with the invention.

FIG. 4 shows the effect of aging on the apparent resistivity (and thus the contact resistance) of a nickel contact (thickness: approximately 1.0 μm) formed on one of the above-described disks in accordance with this invention. This contact is represented by plot 11 in FIG. 2. After being provided with a protective coating of gold (thickness, 1.0 μm) and then being annealed at 450° C. in air for 30 minutes, the contact was permitted to age at room temperature. Its apparent resistivity was measured once every 24 hours for two weeks. The results are presented in plot 14. The initial apparent resistivity of the contact was not changed by the annealing and remained at the same value thereafter. The shaded data points in FIG. 4 represent the same contact, whose resistivity was again measured at intervals after annealing at 700° C. for 30 minutes in air. The initial resistivity increased slightly but was unaltered with field by heat treatment and subsequent aging at room temperature.

I do not wish to be bound by any theories as to the mechanism involved in forming low-resistance, stable, ohmic contacts in accordance with the invention as exemplified above. It is my opinion, however, that the above-described laser-melting of nickel and aluminum layers on $BaTiO_3$ leads to reactions between metal and oxygen atoms, completely disrupting the space-charge layer or creating a high concentration of vacancies in the $BaTiO_3$ substrate just beneath the deposited layers. The enhanced oxygen-vacancy concentration or n-type conductivity leads to reduced current-barrier-thickness and hence provides low-resistance ohmic contacts. Similarly, when the $BaTiO_3$ disks are sputter-cleaned by 1-keV argon ions before the deposition of metallic layers, the energetic argon ions create a near-surface region of high vacancy (oxygen) concentration through an atomic displacement process, thus decreasing the barrier thickness. In contrast, electron-beam-evaporation does not affect the barrier, resulting in high-resistance non-ohmic contacts.

The tunneling current through a barrier is proportional to exp $(-\text{const}\times\phi^{\frac{1}{2}}t)$, where $\phi$ is the barrier height and t is the barrier thickness. The thickness decreases with increasing (uncompensated) doping density N, as $t \propto N^{-\frac{1}{2}}$. Hence, a substantial increase in tunneling current may be obtained by creating under a contact a region of high doping density. In the perovskite class of transition metal oxides—such as $BaTiO_3$, $KTaO_3$, and $KNbO_3$,—it has been shown that absorbed oxygen at the surface provides acceptor states and acts as a barrier for contact formation. The n-type conductivity is derived primarily from oxygen vacancies. Thus, in the case of such substrates, I prefer to form the ohmic contacts by laser-melting films of metallic materials having a relatively strong affinity for oxygen. The following are a few examples of suitable oxygen-getting electroding materials: aluminum, chromium, titanium, nickel, and alloys thereof.

In a typical application, the invention is used to form ohmic contacts for connecting leads to the emitter and collector of a conventional n-type polycrystalline $BaTiO_3$ wafer containing a p-n junction. Any suitable mask is positioned on the substrate to define the configuration of the contacts. A film of metallic electroding material then is deposited through the opening in the mask, after which the mask is removed. The film is laser-melted in accordance with the invention, to form a low-resistance ohmic contact. Any suitable electrical lead then is connected to the contact in conventional fashion. Typically, cleaning of the contact is not required before connection of the lead.

Although the invention has been illustrated above in terms of the formation of uniform, low-resistance, thermally stable ohmic contacts on n-type semiconducting oxides, it is also applicable to the formation of contacts on p-type semiconducting oxides—as, for instance, oxygen-doped $BaTiO_3$ or nickel oxide. Also, it is applicable to both polycrystalline and monocrystalline oxides. For p-type substrates, metals having relatively small oxygen affinity should be used—e.g., the noble metals—and the deposition should be carried out in an oxygen-rich atmosphere in order to ensure preservation of the acceptor states. For both n-type and p-type substrates, the electroding metal or alloy preferably is deposited as a uniform film having a thickness of about a micron; in general, thicknesses in the range of from about 0.5 to 1.5 μm or even larger can be used.

The invention is not limited to the use of Q-switched ruby lasers, but also may be practiced with other Q-switched lasers, such as the Nd-YAG type. As illustrated in terms of a Q-switched ruby laser, the invention may be practiced with pulse energy densities in the range of from about 1.0 to 1.5 J $cm^{-2}$ and pulse durations in the range of from about 15 to 25 n-sec. The equivalent parameters for a Q-switched Nd-YAG laser would be approximately 5 to 7 J $cm^{-2}$ and 100 to 110 n-secs. It will be understood that the invention may be practiced with any electroding metal or alloy equivalent to those described herein.

In the above-described examples, the surface layer of oxide immediately underlying the metallic film was melted to a depth of about 100 Å. It will be understood that it is within the scope of the invention to effect melting of the oxide surface to greater or smaller depths consistent with producing a low-resistant ohmic contact without appreciably impairing the electrical properties of the substrate. Given the teachings herein, one versed in the art will be able to determine suitable parameters for a particular application of this invention without resorting to more than routine experimentation.

The foregoing description of a preferred embodiment of the invention has been presented for purposes of illustration and description and is not intended to be exhaustive or to limit the invention to the precise form disclosed. It was chosen and described in order to best explain the principles of the invention and their practical application to thereby enable others skilled in the art to best utilize the invention in various embodiments and with various modifications as are suited to the particular use contemplated. It is intended that the scope of the invention be defined by the claims appended hereto.

What is claimed is:

1. A method for forming an ohmic contact on a semiconducting oxide, comprising:

depositing on said oxide a film of metallic electroding material, and irradiating said film with a Q-switched laser pulse effecting melting of said film and localized melting of the surface layer of said oxide underlying said film.

2. The method of claim 1 wherein said film has a thickness in the range of from about 0.5 to 2.0 μm.

3. The method of claim 1 wherein said laser pulse is generated by a ruby laser and has an energy density in the range of from about 1.0 to 1.5 J $cm^{-2}$ and a duration of from about 15 to 25 nanoseconds.

4. The method of claim 1 wherein said laser pulse is generated by a YAG-Nd laser and has an energy density in the range of from about 5 to 7 J $cm^{-2}$ and a duration of from about 100 to 110 nanoseconds.

5. The method of claim 1 wherein said metallic material is selected from the group consisting of aluminum, nickel, titanium, and chromium, and alloys thereof.

6. The method of claim 1 wherein said metallic material is selected from the group consisting of gold, silver, members of the platinum family, and alloys thereof.

7. A method for forming an ohmic contact on an n-type semiconducting oxide, comprising:

providing a surface of said oxide with a film of a metallic electroding material which in the molten state functions as an oxygen getter, and irradiating said film with a single laser pulse effecting complete melting of said film and superficial melting of said oxide in the region immediately underneath said film.

8. The method of claim 7 wherein said film has a thickness in the range of from about 0.5 to 1.5 μm.

9. The method of claim 7 wherein said laser pulse is generated by a Q-switched ruby laser and has an energy level in the range of from about 1.0 to 1.5 J $cm^{-2}$ and a duration of from about 15 to 25 nanoseconds.

10. The method of claim 7 wherein said laser pulse is generated by a Nd-YAG laser and has an energy level in the range of from 5 to 7 J $cm^{-2}$ and a duration of from about 100 to 110 nanoseconds.

11. The method of claim 7 wherein said irradiating is conducted in air.

12. The method of claim 7 wherein said metallic material is selected from the group consisting of aluminum, chromium, nickel, titanium, and alloys thereof.

13. The method of claim 7 wherein said oxide is selected from the group consisting of barium titanate, lithium niobate, and zinc oxide.

14. A method for forming an ohmic contact on a semiconducting-oxide body containing a p-n junction, comprising:

providing a surface of said body with a film of metallic electroding material, said film having a thickness in the range of from about 0.5 to 1.5 μm, and irradiating said film with one of (a) a pulse generated by a Q-switched ruby laser, said pulse having an energy density in the range of from about 1.0 to 1.5 J $cm^{-2}$ and a duration of from about 15 to 25 nanoseconds and (b) a pulse generated by a Q-switched Nd-YAG laser, said pulse having an energy density in the range of from about 5 to 7 J $cm^{-2}$ and a duration of from about 100 to 110 nanoseconds, to effect complete melting of said film and localized melting of the surface layer of said oxide in facial contact with said film.

15. The method of claim 14 wherein said oxide is barium titante.

16. The method of claim 14 wherein said contact is a low-resistance ohmic contact.

17. A method for forming an ohmic contact on barium titanate, comprising:

depositing on said oxide a film of metallic electroding material, and irradiating said film with a Q-switched laser pulse effecting melting of said film and localized melting of the surface layer of said oxide underlying said film.

* * * * *